(12) United States Patent
Kim et al.

(10) Patent No.: US 8,373,816 B2
(45) Date of Patent: Feb. 12, 2013

(54) LIQUID CRYSTAL DISPLAY DEVICE AND METHOD OF ASSEMBLING THE LIQUID CRYSTAL DISPLAY DEVICE

(75) Inventors: Kwang-Jae Kim, Uijeongbu-si (KR); Han-Jin Ryu, Seongnam-si (KR); Sang-Moon Moh, Cheonan-si (KR); Hong-Sig Chu, Cheonan-si (KR); Sang-Don Bae, Seoul (KR); In-Jae Hwang, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 602 days.

(21) Appl. No.: 12/607,846

(22) Filed: Oct. 28, 2009

(65) Prior Publication Data
US 2010/0110327 A1    May 6, 2010

(30) Foreign Application Priority Data

Oct. 31, 2008   (KR) ................................ 2008-107649

(51) Int. Cl.
*G02F 1/13357* (2006.01)
*H01J 9/20* (2006.01)

(52) U.S. Cl. ............ 349/58; 349/65; 349/149; 349/150; 362/612; 445/24

(58) Field of Classification Search .................... 349/58, 349/65, 149, 150, 151; 361/749, 679.21, 361/679.22, 679.26, 748, 752; 362/97.2, 362/97.3, 612, 631; 445/24
See application file for complete search history.

(56) References Cited

U.S. PATENT DOCUMENTS

| 7,887,210 | B2* | 2/2011 | Kim | 362/97.3 |
| 2004/0263452 | A1* | 12/2004 | Kim | 345/87 |
| 2006/0114694 | A1* | 6/2006 | Cho et al. | 362/631 |
| 2006/0203140 | A1* | 9/2006 | Kim | 349/58 |
| 2008/0074902 | A1* | 3/2008 | Oh et al. | 362/612 |

* cited by examiner

*Primary Examiner* — Dung Nguyen
*Assistant Examiner* — Tai Duong
(74) *Attorney, Agent, or Firm* — Innovation Counsel LLP (57) ABSTRACT

A liquid crystal display (LCD) device includes an LCD panel displaying an image, a light source providing the LCD panel with light, a light source flexible printed circuit board (FPCB), a printed circuit board (PCB), and a receiving container. The PCB is electrically connected to the LCD panel. The PCB is in contact with two ends of the light source FPCB. The receiving container is combined with the light source FPCB and the PCB. The receiving container has a through-hole through which the light source FPCB passes. According to the present invention, the receiving container applies pressure so that both ends of the light source FPCB make contact with the PCB and the light source FPCB is electrically connected to the PCB. The light source FPCB, the receiving container, and the PCB are secured to each other. Therefore, the number of steps required to assembly the LCD device may be reduced.

18 Claims, 6 Drawing Sheets

FIG. 6

LIQUID CRYSTAL DISPLAY DEVICE AND METHOD OF ASSEMBLING THE LIQUID CRYSTAL DISPLAY DEVICE

PRIORITY STATEMENT

This application claims priority under 35 U.S.C. §119 to Korean Patent Application No. 2008-107649, filed on Oct. 31, 2008 in the Korean Intellectual Property Office (KIPO), the contents of which are herein incorporated by reference in their entirety.

BACKGROUND OF THE INVENTION

1. Field of the Invention

Example embodiments of the present invention relate to a liquid crystal display (LCD) device and a method of assembling the LCD device. More particularly, example embodiments of the present invention relate to an LCD device with reduced number of assembly steps, and a method of assembling the LCD device.

2. Description of the Related Art

In a conventional liquid crystal display (LCD) device, an electric field applied to a liquid crystal layer is controlled by an image signal applied to a plurality of control switches arranged in a matrix form, and the optical transmittance of liquid crystal molecules is controlled by the electric field to display an image. The LCD device includes an LCD panel displaying an image, a driving integrated chip (IC) for operating the LCD panel, a light-emitting diode (LED) driving part for operating an LED that is a light source, and a container for receiving the elements of the LCD device.

Generally, many assembly steps are necessary to connect the LED to a printed circuit board (PCB) on which the LED driving part is mounted. Therefore, the assembly process may be difficult and expensive.

SUMMARY OF THE INVENTION

Example embodiments of the present invention provide a liquid crystal display (LCD) device having reduced number assembly steps and reduced manufacturing costs.

Example embodiments of the present invention provide a method of assembling the LCD device.

In accordance with one aspect of the present invention, an LCD device includes an LCD panel displaying an image, a light source providing the LCD panel with light, a light source flexible printed circuit board (FPCB), a printed circuit board (PCB), and a receiving container. The light source is mounted on the light source FPCB. The PCB is electrically connected to the LCD panel. The PCB is in contact with both ends of the light source FPCB. The receiving container is combined with the light source FPCB and the PCB. The receiving container has a through-hole through which the light source FPCB passes.

In one example embodiment of the present invention, the light source FPCB may include a main film extending in a first direction, a first sub-film, and a second sub-film. The first sub-film extends from a first end of the main film in a second direction substantially perpendicular to the first direction. The second sub-film extends from a second end of the main film in the second direction.

In one example embodiments of the present invention, the first and second ends of the main film may bend to a rear surface of the receiving container. The first sub-film and the second sub-film may each pass through a through-hole on the receiving container.

In some example embodiments of the present invention, the receiving container may include a protrusion portion extending from a lower surface thereof. The through-hole may be formed at the protrusion portion. The first sub-film and the second sub-film may be disposed on the protrusion portion of the receiving container. The PCB may be disposed between the first sub-film and the second sub-film. The PCB may be disposed to be substantially parallel with the LCD panel and the protrusion portion.

In some example embodiments of the present invention, the LCD panel may include a driving circuit part to operate the LCD panel. The PCB may include a timing controller and a power supply part. The timing controller provides the driving circuit part with a data signal and a control signal. The power supply part supplies the driving circuit part and the timing controller with power.

In some example embodiments of the present invention, the PCB may include a substrate-contact pattern electrically connected to the light source FPCB. The light source FPCB may include a film-contact pattern electrically connected to the PCB. The receiving container may include an embossed pattern formed correspondingly to the substrate-contact pattern and the film-contact pattern.

In some example embodiments of the present invention, the PCB may have a substrate-combination hole. The receiving container may have a chassis-combination hole. The light source FPCB may have a film-combination hole. The substrate-combination hole, the chassis-combination hole, and the film-combination hole may be secured to each other by a fixing member. The fixing member may be at least one of a screw, a bolt, and a nut.

In some example embodiments of the present invention, the PCB may have a substrate-hook protrusion. The receiving container may have a chassis-hook hole. The light source FPCB may have a film-hook hole. The substrate-hook hole, the chassis-hook hole and the film-hook hole may be secured to each other by a hook.

In one example embodiments of the present invention, the light source may be a light-emitting diode (LED). The PCB may include an LED driving part.

In accordance with another aspect of the present invention, a method of assembling an LCD device is provided. In the method, a light source FPCB, a PCB and a receiving container are provided. A light source is mounted on the light source FPCB. The PCB is electrically connected to an LCD panel receiving light from the light source to display an image. The receiving container has two through-holes. Two ends of the light source FPCB passes through a through-hole. A reflective plate, a light guide plate, a mold frame, a plurality of optical sheets, and the LCD panel connected to the PCB are successively disposed. A film-contact pattern of the light source FPCB electrically contacts a substrate-contact pattern of the PCB.

In one example embodiment of the present invention, fixing members may pass through the film-combination holes formed at both ends of the light source FPCB, substrate-combination holes formed at the PCB, and chassis-combination holes formed at the receiving container, to electrically contact the film-contact pattern with the substrate-contact pattern.

In one example embodiment of the present invention, the film-contact pattern may electrically contact the substrate-contact pattern by an embossed pattern formed at the receiving container.

According to some example embodiments of the present invention, a receiving container applies pressure to both ends of a light source FPCB so that the light source FPCB contacts the PCB, to create electrical connection between the light source FPCB to the PCB, and to secure the light source FPCB, the receiving container, and the PCB. Accordingly, the number of steps of assembling the LCD and the associated costs may be reduced.

BRIEF DESCRIPTION OF THE DRAWINGS

The above and other features and advantages of the present invention will become more apparent through descriptions referencing exemplary embodiments with reference to the accompanying drawings.

DETAILED DESCRIPTION OF THE INVENTION

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure is thorough and complete, and fully conveys the scope of the present invention to those skilled in the art. In the drawings, the sizes and relative proportions of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

Figure 1:
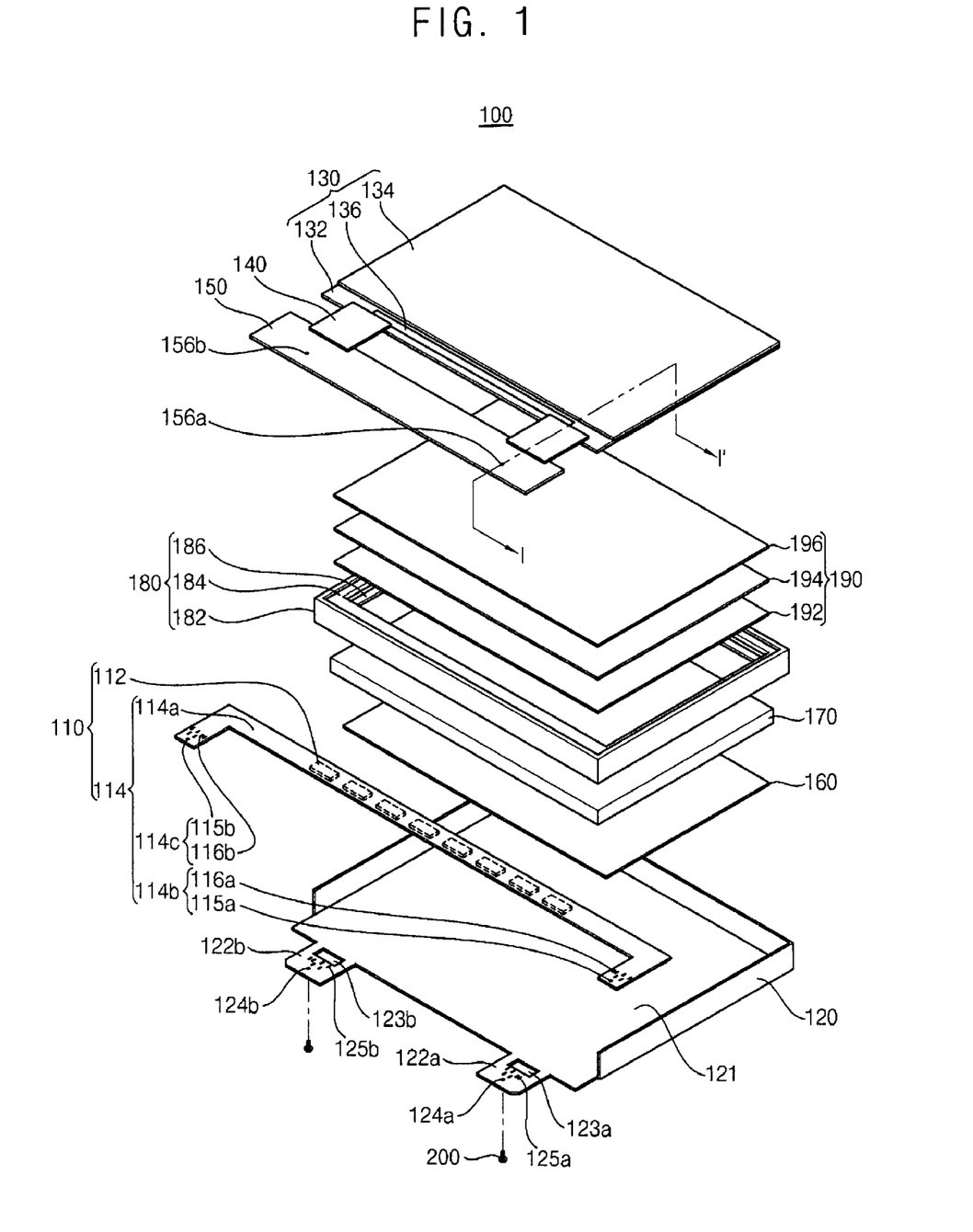
FIG. 1 is an exploded perspective view illustrating a liquid crystal display (LCD) device in accordance with an example embodiment of the present invention.
Figure 2:
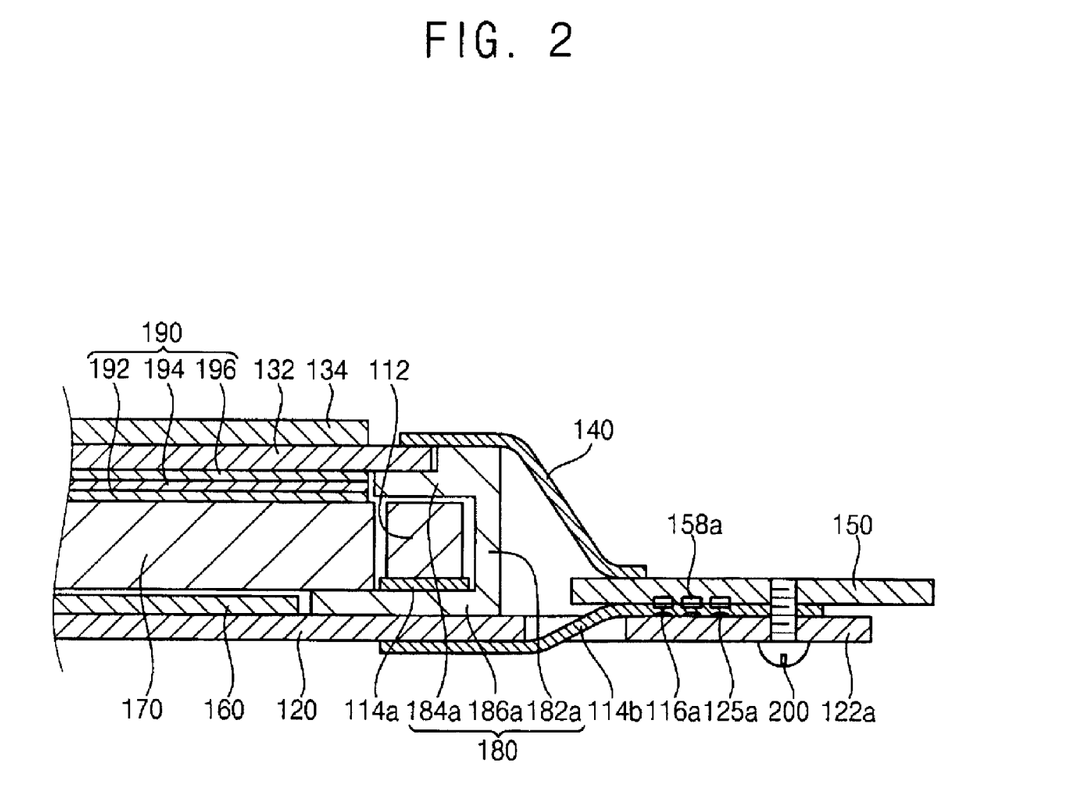
FIG. 2 is a cross-sectional view of the LCD device taken along a line I-I' in FIG. 1.
Figure 3:
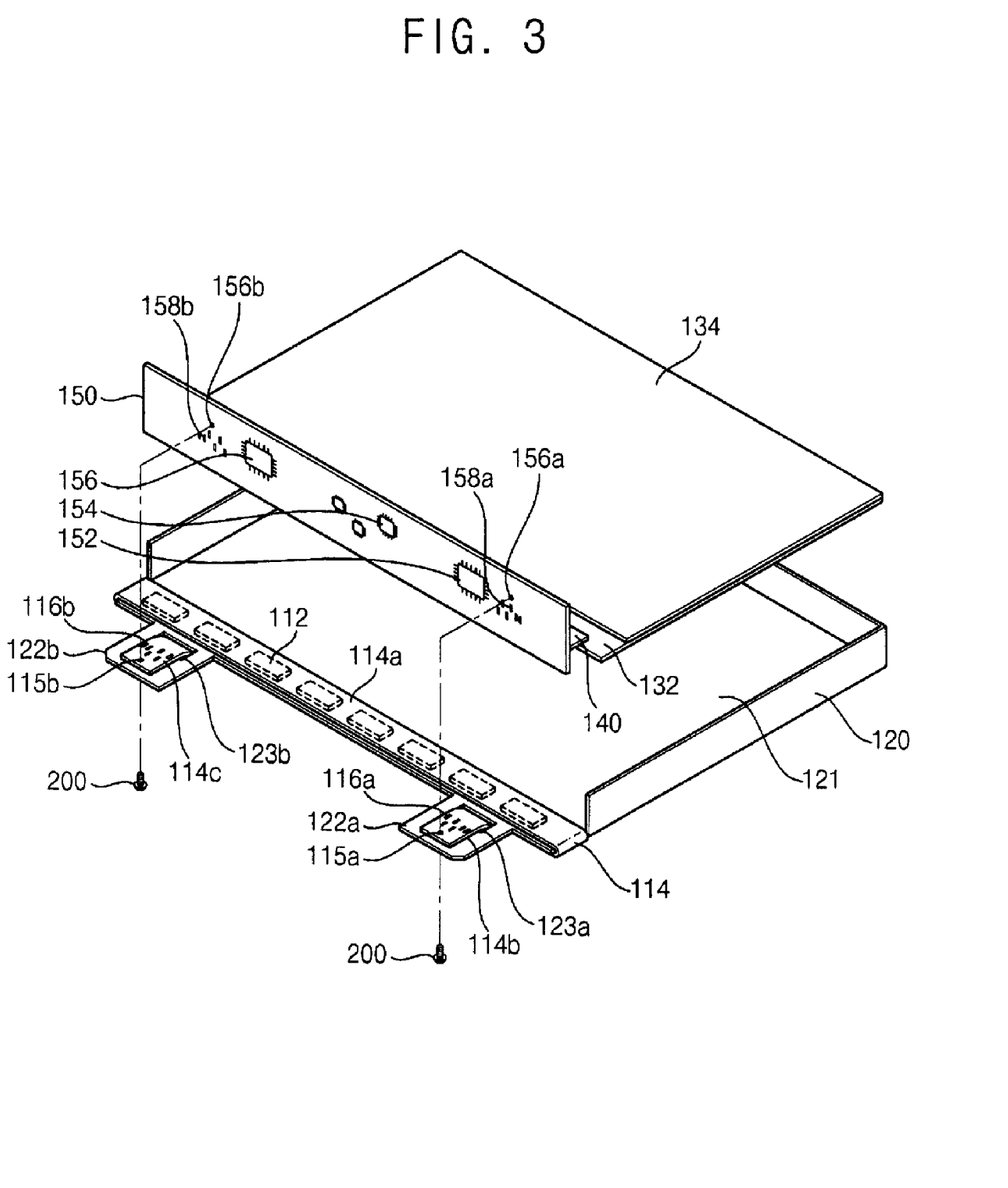
FIG. 3 is a perspective view illustrating a light source flexible printed circuit board (FPCB), a receiving container, and a printed circuit board (PCB) that are shown in the LCD device illustrated in FIG. 1.

FIG. 1 is an exploded perspective view illustrating a liquid crystal display (LCD) device in accordance with an example embodiment of the present invention. FIG. 2 is a cross-sectional view of the LCD device taken along a line I-I' in FIG. 1. FIG. 3 is a perspective view illustrating a light source flexible printed circuit board (FPCB), a receiving container, and a printed circuit board (PCB) that are included in the LCD device illustrated in FIG. 1.

Referring to FIGS. 1, 2, and 3, an LCD device 100 in accordance with an example embodiment of the present invention includes a light source part 110, a receiving container 120, an LCD panel 130, a main FPCB 140, a PCB 150, a reflective plate 160, a light guide plate 170, a mold frame 180, and a plurality of optical sheets 190.

The light source part 110 may include a light-emitting diode (LED) 112 and a light source FPCB 114.

The LED 112 may be mounted on the light source FPCB 114 and disposed at a side of the light guide plate 170. The number of the LEDs 112 may vary according to the optical efficiency of the LED 112 and the size of the light guide plate 170.

The light source FPCB 114 may include a main film 114a, a first sub-film 114b, and a second sub-film 114c. The main film 114a extends in a first direction. The first sub-film 114b extends from a first end of the main film 114a in a second direction substantially perpendicular to the first direction. The second sub-film 114c extends from a second end of the main film 114a in the second direction. The main film 114a, the first sub-film 114b, and the second sub-film 114c may be integrally formed.

The first sub-film 114b may have a first film-combination hole 115a and a first film-contact pattern 116a. The second sub-film 114c may have a second film-combination hole 115b, and a second film-contact pattern 116b.

The light source FPCB 114 and the PCB 150 are combined with the receiving container 120 through the first and second film-combination holes 115a and 115b. The light source FPCB 114 and the PCB 150 may be electrically connected to each other through the first and second film-contact patterns 116a and 116b.

The receiving container 120 forms a receiving space therein. The reflective plate 160 and the light guide plate 170 are received in the receiving space of the receiving container 120. The receiving container 120 may receive the LEDs 112 mounted on the main film 114a of the light source FPCB 114.

The main film 114a extends to both ends of the receiving container 120 in the first direction. Both ends of the main film 114a may bend to a rear surface of the receiving container 120.

A lower surface 121 of the receiving container 120 may include a first protrusion portion 122a and a second protrusion portion 122b. The first and second protrusion portions 122a and 122b may protrude to the outside of the receiving space which receives the LED 112, and be combined with the PCB 150, and the first and second sub-films 114b and 114c of the light source FPCB 114. The first protrusion portion 122a may include a first through-hole 123a, a first chassis-combination hole 124a, and a first embossed pattern 125a. The second protrusion portion 122b may include a second through-hole 123b, a second chassis-combination hole 124b, and a second embossed pattern 125b.

The two ends of the main film 114a that bend to the rear surface of the receiving container 120 may extend toward the first protrusion portion 122a and the second protrusion portion 122b, and the first and second sub-films 114b and 114c may be disposed between the receiving container 120 and the PCB 150 through the first and second through-holes 123a and 123b.

The light source FPCB 114 and the PCB 150 are secured to the receiving container 120 through the first and second chassis-combination holes 124a and 124b. The light source FPCB 114 and the PCB 150 may be electrically connected to each other through the first and second embossed patterns 125a and 125b.

The first and second embossed patterns 125a and 125b apply pressure to the light source FPCB 114 so that the light source FPCB 114 is electrically connected to the PCB 150.

The receiving container 120 protects the elements such as the reflective plate 160, the light guide plate 170, the optical sheets 190, etc., and prevents the elements from separating from each other. Further, the receiving container 120 may disperse heat generated from the light source part 110.

The LCD panel 130 receives light from the light source part 110 and displays an image. The LCD panel 130 includes a thin-film transistor (TFT) substrate 132, a color filter substrate 134, and a liquid crystal layer interposed between the substrates 132 and 134. A driving integrated circuit 136 for operating the LCD panel 130 may be mounted on a side of the LCD panel 130.

The main FPCB 140 is an anisotropic conductive film. The main FPCB 140 electrically connects the LCD panel 130 to the PCB 150. The main FPCB 140 may be attached to a side of the TFT substrate 132 and a side of the PCB 150.

In this example embodiment, the driving integrated circuit 136 may be mounted on the TFT substrate 132 using an advanced chip-on-glass (ACOG) method. Since the additional receiving space is not necessary, the thickness of the LCD device may be reduced. The driving integrated circuit 136 may be a tape carrier package (TCP) mounted on the main FPCB 140.

In order to reduce the thickness of the LCD device, the PCB 150 is not folded to overlap the LCD panel 130, instead, the PCB 150 is placed in the receiving container 120 in an open state where the FPCB 140 is planar. For example, the PCB 150 may be disposed on the receiving container 120 in parallel with the receiving container 120 to be combined with the receiving container 120.

The PCB 150 may further include a timing controller 152, a power supply part 154, an LED driving part 156, a first substrate-combination hole 156a, a second substrate-combination hole 156b, a first substrate-contact pattern 158a, and a second substrate-contact pattern 158b.

The timing controller 152 controls the driving integrated circuit 136. The power supply part 154 supplies power to operate the LCD panel 130. The LED driving part 156 operates the LED 112 of the light source part 110.

The light source FPCB 114 and the PCB 150 are combined with the receiving container 120 through the first and second substrate-combination holes 156a and 156b. The light source FPCB 114 and the PCB 150 may be electrically connected to each other through the first and second substrate-contact patterns 158a and 158b.

The conductive first and second film-contact patterns 116a and 116b and the conductive first and second substrate-contact patterns 158a and 158b are formed at positions corresponding to the first and second embossed patterns 125a and 125b. The first and second embossed patterns 125a and 125b apply pressure to the first and second film-contact patterns 116a and 116b and the first and second substrate-contact patterns 158a and 158b to keep them in contact with each other.

Therefore, the conductive first and second film-contact patterns 116a and 116b, which are formed at both ends of the light source FPCB 114 and pass through the first and second through-holes 123a and 123b, may contact the first and second substrate-contact patterns 158a and 158b of the PCB 150.

The first and second film-contact patterns 116a and 116b face the first and second substrate-contact patterns 158a and 158b, respectively.

Accordingly, the first embossed pattern 125a concentrates pressure on a region between the first contact pattern 116a and the first substrate-contact pattern 158a, and the second embossed pattern 125b concentrates pressure on a region between the second contact pattern 116b and the second substrate-contact pattern 158b.

The reflective plate 160 is a plate having high optical reflectivity. The reflective plate 160 may be disposed on a bottom surface 121 of the receiving container 120 to reflect light incident from the light source part 110 toward a rear surface of the light guide plate 170.

The light guide plate 170 transforms linear light, which is generated from the LED 112 of the light source part 110 disposed at the side of the receiving container 120, to planar light, and emits the planar light to the LCD panel 130.

The light guide plate 170 may comprise a transparent material having a uniform refractive index, such as polymethyl methacrylate (PMMA), polyolefin, polycarbonate, etc.

The mold frame 180 includes sidewalls 182 having a rectangular frame shape, an upper surface 184 extending from an upper portion of the sidewalls 182, and a lower surface 186 extending from a lower portion of the sidewalls 182.

The mold frame 180 may include a stepped groove formed on the upper surface 184 to support the LCD panel 130.

A portion of the upper surface 184 may be broader than other portions of the upper surface 184 to receive the light source part 110.

A side portion of the receiving space, which is formed by the sidewalls 182, the upper surface 184, and the lower surface 186, receives the light source part 110.

The reflective plate 160 is received in the receiving container 120 with the mold frame 180. The light guide plate 170 is disposed on a side portion of the light source part 110, the upper surface 184 of the mold frame 180, and the reflective plate 160.

The optical sheets 190 are disposed over the light guide plate 170. The optical sheets 190 make the brightness of the light passing through the light guide plate 170 uniform, and emit the light to the LCD panel 130.

The optical sheets 190 may include a diffusing sheet 192, a prism sheet 194, and a protective sheet 196. The diffusing sheet 192 evenly disperses the light passing through the light guide plate 170. The prism sheet 194 refracts and concentrates the light passing through the diffusing sheet 192 to increase the brightness of the light. The protective sheet 196 protects the prism sheet 194 and diffuses the light to broaden the viewing angle narrowed by the prism sheet 194.

The diffusing sheet 192, the prism sheet 194, and the protective sheet 196 may be successively stacked over the light guide plate 170.

In order to connect LEDs to a PCB on which an LED driving part is mounted in a conventional LCD device, a connector is necessary to connect the PCB to an FPCB on which the LEDs are mounted, and the receiving container should have a flange for securing the PCB. Therefore, many processing steps are necessary to assemble the conventional LCD device. However, the PCB 150 of the LCD device 100 in accordance with the present invention does not fold upon the rear face of the receiving container 120, but is directly placed in the receiving container 120. Therefore, the LCD device 100 may have a slim profile.

Further, the receiving container 120 includes the first and second through-holes 123a and 123b formed at the first and second protrusion portions 122a and 122b, respectively, so that the PCB 150 is secured to the receiving container 120 and electrically connected to the light source FPCB 114.

Figure 4A:
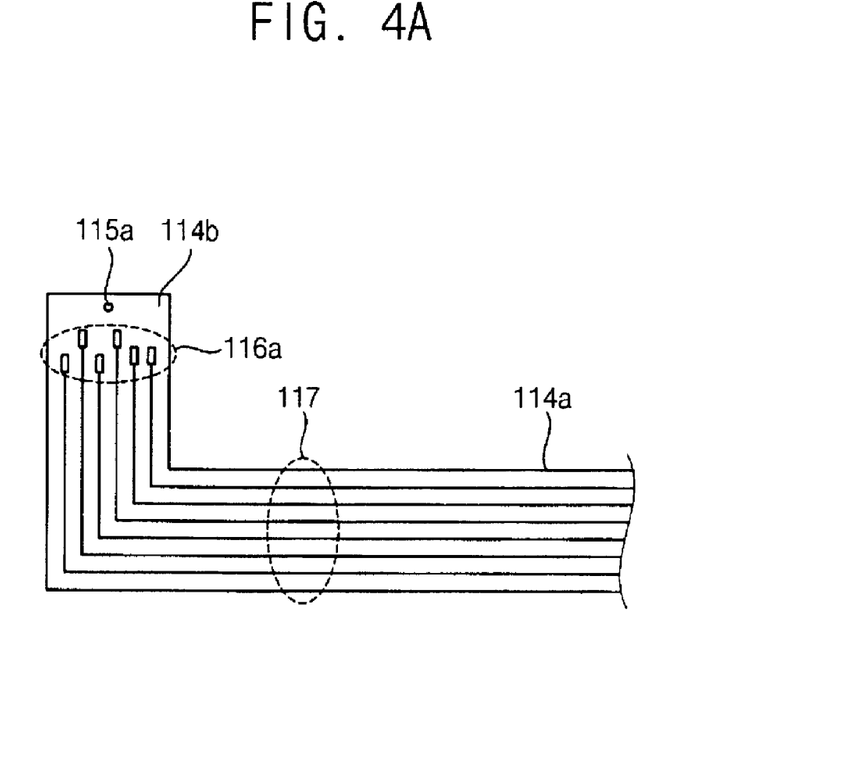
FIG. 4A is an expanded plan view illustrating the light source FPCB of the LCD device shown in FIG. 1.

FIG. 4A is an expanded plan view illustrating the light source FPCB of the LCD device shown in FIG. 1.

Referring to FIGS. 1 and 4A, the first sub-film 114b of the light source FPCB 114 has the first film-combination hole 115a and the first film-contact pattern 116a.

A screw 200 for securing the light source FPCB 114 to the receiving container 120 and the PCB 150 may pass through the first film-combination hole 115a.

The first film-contact pattern 116a may comprise a conductive material, and be formed at the first sub-film 114b to electrically connect the light source FPCB 114 to the PCB 150.

Although only the first film-combination hole 115a and the first film-contact pattern 116a of the first sub-film 114b are described in FIG. 4A, the light source FPCB 114 includes the second sub-film 114c having the second film-combination hole 115b and the second film-contact pattern 116b. The structure and function of the second film-combination hole 115b and the second film-contact pattern 116b of the second sub-film 114c illustrated in FIG. 1 are substantially the same as those of the first film-combination hole 115a and the first film-contact pattern 116a, respectively, and thus further descriptions concerning the second sub-film 114c is omitted.

The LED 112 is mounted on the main film 114a of the light source FPCB 114. A plurality of printed circuit lines 117 may connect the LED to the first film-contact pattern 116a.

Figure 4B:
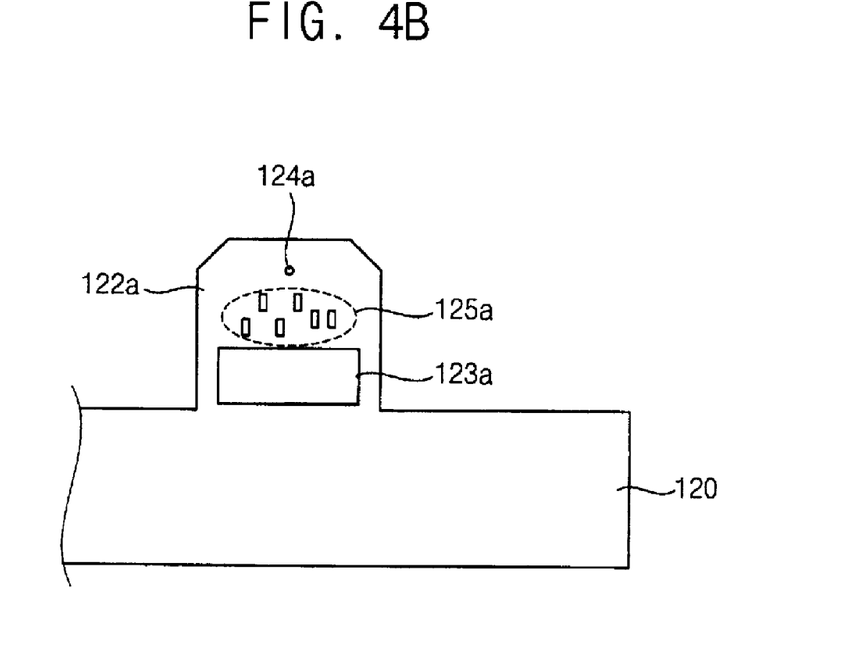
FIG. 4B is an expanded plan view illustrating the receiving container of the LCD device shown in FIG. 1.

FIG. 4B is an expanded plan view illustrating the receiving container of the LCD device shown in FIG. 1.

Referring to FIGS. 1 and 4B, the first protrusion portion 122a protrudes out of the receiving space to receive the LED 112. The first protrusion portion 122a may include the first through-hole 123a, the first chassis-combination hole 124a, and the first embossed pattern 125a.

The first through-hole 123a is a through-hole through which the first sub-film 114b of the light source FPCB 114 passes so that the light source FPCB 114 extending toward the rear surface of the receiving container 120 is disposed between the receiving container 120 and the PCB 150.

A screw 200 for securing the first sub-film 114b to the receiving container 120 and the PCB 150 may pass through the first chassis-combination hole 124a.

The first embossed pattern 125a may be formed on a portion of the first protrusion portion 122a corresponding to the location of the first film-contact pattern 116a, to electrically connect the first protrusion portion 122a to the PCB 150.

Only the first protrusion portion 122a is described in FIG. 4B. However, the structure and function of the second protrusion portion 122b illustrated in FIG. 1 are substantially the same as those of the first protrusion portion 122a, and thus further descriptions concerning the second protrusion portion 122b is omitted.

Figure 4C:
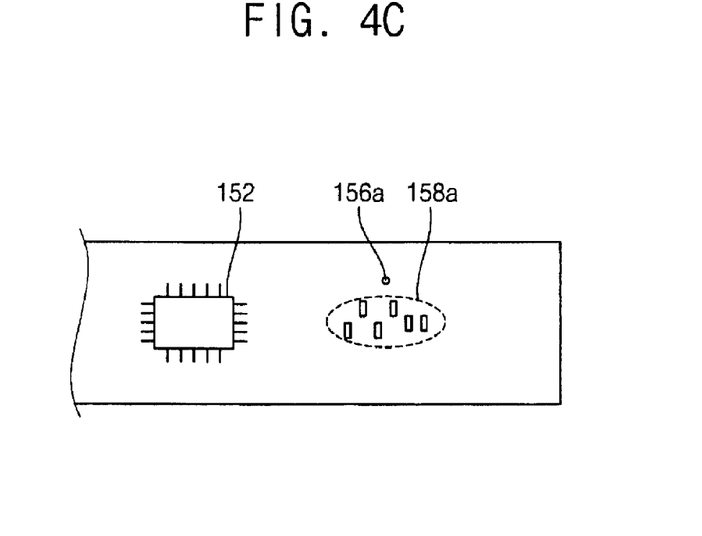
FIG. 4C is an expanded plan view illustrating the PCB of the LCD device shown in FIG. 1.

FIG. 4C is an expanded plan view illustrating the PCB 150 of the LCD device shown in FIG. 1.

Referring to FIGS. 1 and 4C, the PCB 150 may have the first substrate-combination hole 156a and the first substrate-contact pattern 158a formed at one end thereof.

A screw 200 for combining the PCB 150 with the light source FPCB 114 and the receiving container 120 may pass through the first substrate-combination hole 156a, as shown by the broken lines in FIG. 3.

The first substrate-contact pattern 158a may comprise a conductive material. The first substrate-contact pattern 158a may be formed on a portion of the PCB 150 corresponding to the first film-contact pattern 116a, to electrically connect the light source FPCB 114 to the PCB 150.

Accordingly, the first film-contact pattern 116a and the first substrate-contact pattern 158a are disposed at a portion corresponding to the first embossed pattern 125a, so that the first embossed pattern 125a applies pressure to the first film-contact pattern 116a and the first substrate-contact pattern 158a to keep them in contact with each other.

Only the first substrate-combination hole 156a and the first substrate-contact pattern 158a formed at one side of the PCB 150 are described in FIG. 4C. However, the structure and function of the second substrate-combination hole 156b and the second substrate-contact pattern 158b formed at the other side of the PCB 150 are substantially the same as those of the first substrate-combination hole 156a and the first substrate-contact pattern 158a, respectively, and thus further descriptions is omitted.

Figure 5:
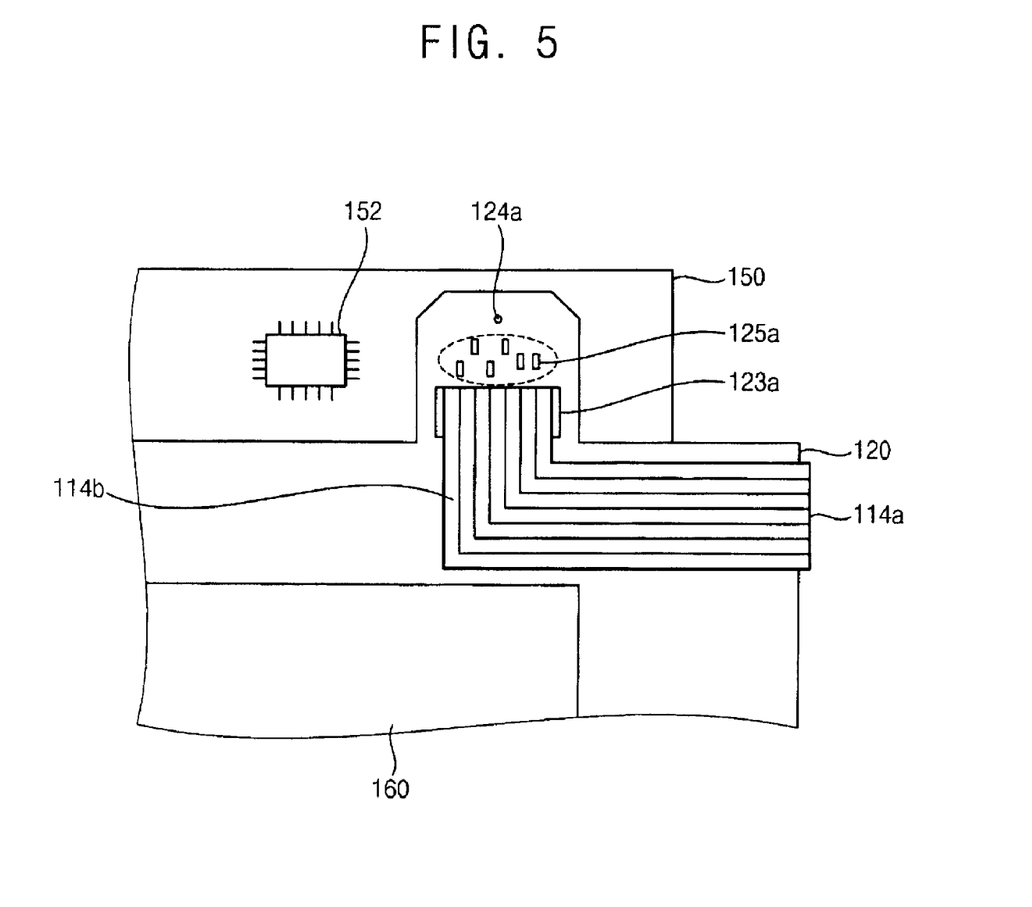
FIG. 5 is a rear plan view illustrating connections among the light source FPCB, the receiving container, and the PCB illustrated in FIGS. 4A, 4B, and 4C, respectively.

FIG. 5 is a rear plan view illustrating connections among the light source FPCB, the receiving container, and the PCB illustrated in FIGS. 4A, 4B and 4C, respectively.

The elements illustrated in FIG. 5 may be substantially the same as those described with reference to FIG. 1. Therefore, the same reference numbers are used for the same or similar elements, and any further descriptions concerning the same or similar elements is omitted.

Referring to FIGS. 1 to 5, the main film 114a bending to the rear surface of the receiving container 120 extends in the first direction. The first sub-film 114b extending from a first end of the main film 114a in the second direction may pass through the first through-hole 123a and be disposed between the receiving container 120 and the PCB 150.

Referring to FIG. 3 the first sub-film 114b, the receiving container 120, and the PCB 150 may be combined with and secured to each other by screws 200 passing through the first film-combination hole 115a, the first chassis-combination hole 124a, and the first substrate-combination hole 156a, respectively.

Accordingly, the first substrate-contact pattern 158a of the PCB may make contact with the first film-contact pattern 116a of the light source FPCB 114 facing the first substrate-contact pattern 158a of the PCB.

Moreover, the first embossed pattern 125a of the receiving container 120 may be formed at a portion corresponding to the formation of the first film-contact pattern 116a and the first substrate-contact pattern 158a, so that the pressure may be concentrated on the contact portion, and thus the contact force may be increased.

Figure 6:
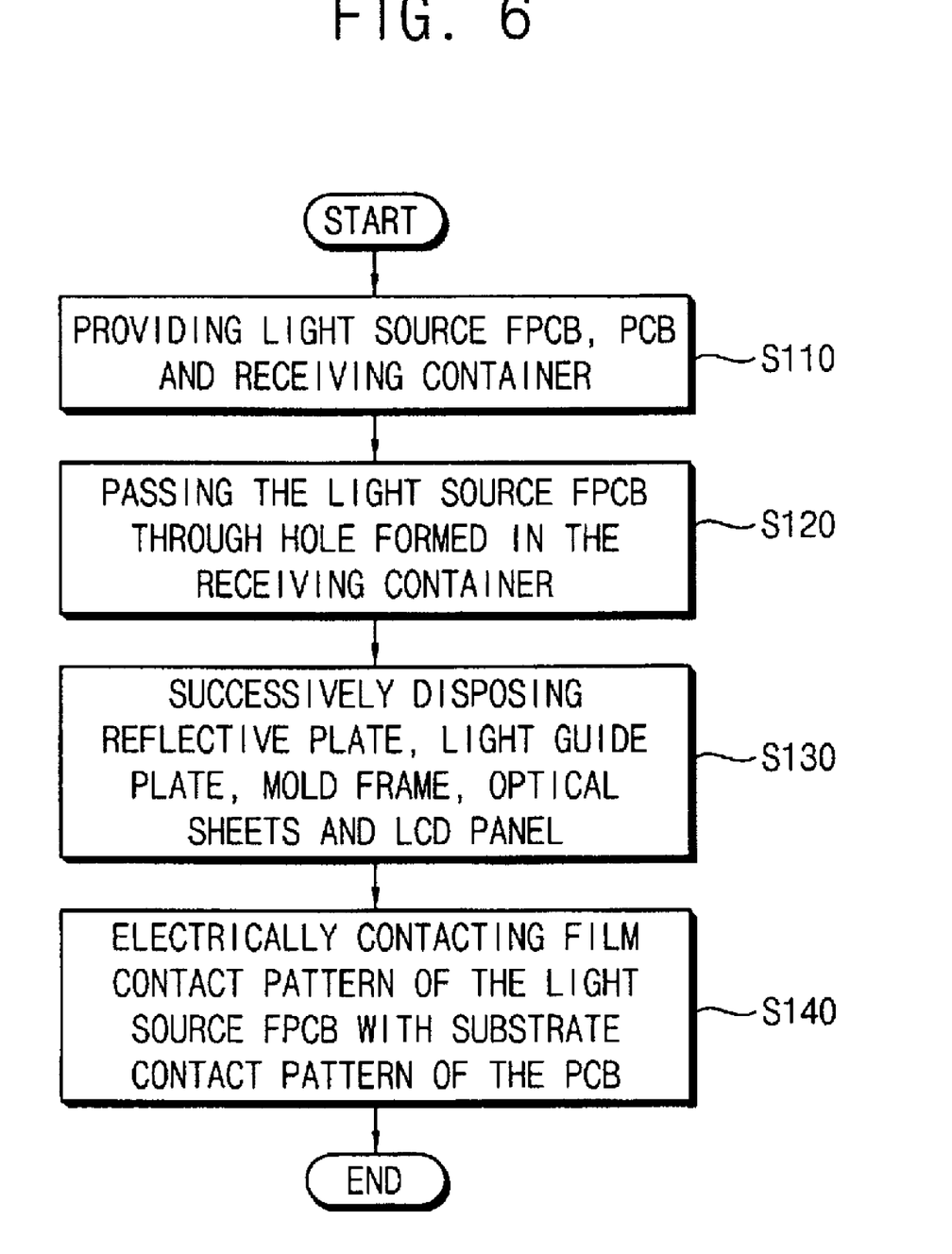
FIG. 6 is a flowchart showing a method of assembling the LCD device illustrated in FIG. 1.

FIG. 6 is a flowchart showing a method of assembling the LCD device illustrated in FIG. 1.

Referring to FIGS. 1 and 4A to 6, the light source FPCB 114, the PCB 150, and the receiving container 120 are provided (step S110). The LED 112 may be mounted on the light source FPCB 114. The PCB 150 is electrically connected to the LCD panel 130 that receives light from the LED 112 and displays an image. The receiving container 120 may have the first and second through-holes 123a and 123b.

The first and second sub-films 114b and 114c of the light source FPCB 114 pass through the first and second through-holes 123a and 123b (step S120).

The reflective plate 160, the light guide plate 170, the mold frame 180, the plurality of optical sheets 190, and the LCD panel 130 connected to the PCB 150 are successively disposed (step S130).

The first film-contact pattern 116a of the first sub-film 114b and the second film-contact pattern 116b of the second sub-film 114c make electrical contact with the first and second substrate-contact patterns 158a and 158b, respectively (step S140).

The screws 200 pass through the first and second film-combination holes 115a and 115b formed at the first and second sub-films 114b and 114c, the first and second substrate-combination holes 156a and 156b formed at the PCB 150, and the first and second chassis-combination holes 124a and 124b formed at the receiving container 120, so that the first and second film-contact patterns 116a and 116b contact the first and second substrate-contact patterns 158a and 158b, respectively.

In this example embodiment of the present invention, the screw 200 is used as a fixing member. Alternatively, a plurality of bolts and nuts may be used as the fixing member. For example, the bolts may pass through the first and second film-combination holes 115a and 115b, the first and second substrate-combination holes 156a and 156b, and the first and second chassis-combination holes 124a and 124b, and then be fixed with the nuts, to secure the light source FPCB 114, the receiving container 120, and the PCB 150.

Alternatively, the light source FPCB 114, the receiving container 120 and the PCB 150 may be secured to each other by a plurality of hooks. For example, a film hook hole and a chassis hook hole may be formed at the light source FPCB 114 and the receiving container 120, respectively, and a substrate hook protrusion may be formed at the PCB 150. The film hook hole, the chassis hook hole, and the substrate hook protrusion may be secured to each other.

According to the example embodiments of the present invention, a first through-hole and a second through-hole are formed at a first protrusion portion and a second protrusion portion of a receiving container, respectively, so that a PCB is fixed to the receiving container and a light source FPCB is electrically connected to the PCB. Therefore, the number of steps required to assembly an LCD device and the cost of manufacturing may be reduced.

The foregoing is illustrative of the present disclosure of invention and is not to be construed as limiting thereof. Although a few example embodiments of the present disclosure of invention have been described, those skilled in the art will readily appreciate in light of the foregoing that many modifications are possible in the example embodiments without materially departing from the novel teachings and advantages of the present disclosure. Accordingly, all such modifications are intended to be included within the scope of the present teachings. In the claims, means-plus-function clauses are intended to cover the structures described herein as performing the recited function and not only structural equivalents but also functionally equivalent structures.

What is claimed is:

1. A liquid crystal display (LCD) device comprising:
an LCD panel configured for displaying an image;
a light source configured for providing the LCD panel with light;
a light source flexible printed circuit board (LS-FPCB) on which the light source is mounted, the LS-FPBC having a main body portion that extends laterally in a positive first direction and also in an opposed negative first direction, the LS-FPBC and having two flexible end portions respectively extending outwardly from the main body portion in the positive and negative first directions respectively;
a non-flexible printed circuit board (PCB) also extending laterally in the positive and negative first directions, the PCB being electrically connected to the LCD panel and the PCB respectively making respective electrical contacts at laterally spaced apart contacting portions thereof respectively with the two flexible end portions of the LS-FPCB; and a receiving container configured to receive into a substantially interior receiving space thereof, an assembly that includes the LCD panel, the light source, and the main body portion of the LS-FPBC, said receiving container having at least a first through-hole communicating between the substantially interior receiving space and an outside of the receiving container and through which through-hole a corresponding first of the two flexible end portions of the LS-FPCB passes.

2. The LCD device of claim 1, wherein:
a first of the two flexible end portions of the LS-FPCB has a first sub-film portion extending therefrom in a second direction substantially perpendicular to the positive and negative first directions; and
a second of the two flexible end portions of the LS-FPCB has a second sub-film portion extending therefrom in the second direction.

3. The LCD device of claim 2, wherein folds are provided to the LS-FPCB such that the first and second flexible end portions of the LS-FPCB are respectively folded to each bend around from a top surface of the receiving container to a rear surface of the receiving container, and wherein the first sub-film portion passes through the first through-hole of the receiving container and the second sub-film portion passes through a second through-hole provided in the receiving container.

4. The LCD device of claim 3, wherein said top and rear surfaces of the receiving container respectively define top and bottom surfaces of a bottom main wall of the receiving container and wherein said bottom main wall has one or more protrusion portions extending therefrom and the first through-hole is formed through a corresponding first of the one or more protrusion portions.

5. The LCD device of claim 4, wherein the first sub-film portion passing through the first through-hole is disposed to extend on the first of the one or more protrusion portions of the receiving container, and a central portion of the PCB is laterally disposed between the first sub-film portion and the second sub-film portion of the LS-FPCB.

6. The LCD device of claim 5, wherein the LCD panel has an LCD panel side extending in the first directions, wherein the one or more protrusion portions of the receiving container have respective protrusion ends extending in the first directions and wherein the PCB has a PCB side extending in the first directions so as to be substantially parallel with the LCD panel side and the one or more protrusion ends.

7. The LCD device of claim 1, wherein the LCD panel includes a driving circuit part to operate the LCD panel.

8. The LCD device of claim 7, wherein the PCB has included thereon:
a timing controller configured for providing the driving circuit part with a data signal and a control signal; and
a power supply part configured for supplying the driving circuit part and the timing controller with power.

9. The LCD device of claim 1,
wherein the PCB includes a substrate-contact pattern formed thereon and by which the PCB makes respective electrical contact to at least one of the two flexible end portions of the LS-FPCB, and
wherein the LS-FPCB includes a film-contact pattern formed thereon and by which the LS-FPCB makes respective electrical contact to at least one of the laterally spaced apart contacting portions of the PCB.

10. The LCD device of claim 9, wherein the receiving container comprises an embossed pattern at a location corresponding to the substrate-contact pattern and the film-contact pattern.

11. The LCD device of claim 1, wherein the PCB has a substrate-combination hole, and the receiving container has a chassis-combination hole, and the light source FPCB has a film-combination hole.

12. The LCD device of claim 11, wherein the substrate-combination hole, the chassis-combination hole, and the film-combination hole are secured to each other by a fixing member.

13. The LCD device of claim 12, wherein the fixing member is at least one of a screw, a bolt, and a nut.

14. The LCD device of claim 1, wherein the light source comprises a light-emitting diode (LED).

15. The LCD device of claim 14, wherein the PCB has included thereon an LED driving part.

16. A method of assembling an LCD device, comprising:
providing a light source FPCB on which a light source is mounted, a PCB electrically connected to an LCD panel and disposed to receive light from the light source for thereby displaying an image, and providing a receiving container having a substantially interior receiving space into which the light source FPCB, the PCB and the LCD panel can be received, the container having a first and a second through-hole each communicating between the substantially interior receiving space and an outside of the receiving container;
passing two flexible end portions of the light source FPCB respectively through the first and second through-holes;
successively disposing into the substantially interior receiving space of the receiving container, a reflective plate, a light guide plate, a mold frame, a plurality of optical sheets, and the LCD panel connected to the PCB; and
electrically contacting a film-contact pattern of the light source FPCB, which film-contact pattern is formed on at least one of the two flexible end portions of the light source FPCB, with a substrate-contact pattern on the PCB.

17. The method of claim 16, wherein said electrically contacting the film-contact pattern with the substrate-contact pattern includes:
fixing the film-contact pattern to the substrate-contact pattern by passing fixing members through film-combination holes formed in the two flexible end portions of the light source FPCB, and through corresponding substrate-combination holes formed in the PCB, and through corresponding chassis-combination holes formed in the receiving container.

18. The method of claim 16, wherein an embossed pattern formed at the receiving container presses the film-contact pattern to electrically contact the substrate-contact pattern.

* * * * *